United States Patent
Li

(10) Patent No.: US 12,237,036 B2
(45) Date of Patent: Feb. 25, 2025

(54) MEMORY TEST METHOD, MEMORY TEST APPARATUS, MEMORY TEST DEVICE, AND STORAGE MEDIUM

(71) Applicant: CHANGXIN MEMORY TECHNOLOGIES, INC., Hefei (CN)

(72) Inventor: Xiaolei Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/607,242

(22) PCT Filed: Jun. 7, 2021

(86) PCT No.: PCT/CN2021/098728
§ 371 (c)(1),
(2) Date: Dec. 8, 2022

(87) PCT Pub. No.: WO2022/252248
PCT Pub. Date: Dec. 8, 2022

(65) Prior Publication Data
US 2024/0021265 A1   Jan. 18, 2024

(30) Foreign Application Priority Data
Jun. 1, 2021 (CN) .......................... 202110609485.4

(51) Int. Cl.
*G11C 29/00* (2006.01)
*G11C 29/56* (2006.01)

(52) U.S. Cl.
CPC .. *G11C 29/56004* (2013.01); *G11C 29/56016* (2013.01); *G11C 2029/5602* (2013.01)

(58) Field of Classification Search
None
See application file for complete search history.

(56) References Cited

U.S. PATENT DOCUMENTS

| 5,446,904 A * | 8/1995 | Belt .................... G06F 1/24 |
| | | 710/1 |
| 8,984,353 B2 * | 3/2015 | Takeuchi ............... G11C 29/50 |
| | | 714/763 |
| 2006/0048023 A1 * | 3/2006 | Hobara ................ G11C 29/48 |
| | | 714/718 |
| 2008/0209100 A1 * | 8/2008 | Wang .................. G06F 11/2221 |
| | | 711/100 |

(Continued)

FOREIGN PATENT DOCUMENTS

| CN | 101256844 A | 9/2008 |
| CN | 102930903 A | 2/2013 |

(Continued)

OTHER PUBLICATIONS

International Search Report in Application No. PCT/CN2021/098728, mailed on Feb. 28, 2022.

*Primary Examiner* — Tan T. Nguyen
(74) *Attorney, Agent, or Firm* — Syncoda LLC; Feng Ma

(57) ABSTRACT

A memory test method includes: obtaining a preset memory and a memory to be tested; setting the memory to be tested as a reserved memory; starting an operating system, wherein the operating system runs in the preset memory; and executing a memory test program to test the memory to be tested, wherein the memory test program runs in the preset memory.

19 Claims, 8 Drawing Sheets

(56) References Cited

U.S. PATENT DOCUMENTS

| | | |
|---|---|---|
| 2013/0238284 A1 | 9/2013 | Liu |
| 2019/0129818 A1* | 5/2019 | Kannan ............... G06F 11/0772 |
| 2023/0207021 A1* | 6/2023 | Guo .................. G11C 16/3459 |
| | | 365/201 |

FOREIGN PATENT DOCUMENTS

| | | |
|---|---|---|
| CN | 102930903 B | 9/2015 |
| CN | 205680083 U | 11/2016 |
| CN | 112817844 A | 5/2021 |

* cited by examiner

MEMORY TEST METHOD, MEMORY TEST APPARATUS, MEMORY TEST DEVICE, AND STORAGE MEDIUM

CROSS-REFERENCE TO RELATED APPLICATIONS

This application is a national stage of International Application No. PCT/CN2021/098728 filed on Jun. 7, 2021, which claims priority to Chinese Patent Application No. 202110609485.4 filed on Jun. 1, 2021. The disclosures of these applications are hereby incorporated herein by reference in their entirety.

TECHNICAL FIELD

Embodiments of the present disclosure relate to, but are not limited to, a memory test method, a memory test apparatus, a memory test device, and a storage medium.

BACKGROUND

A memory is one of the most important components of a system platform, and all programs in the system platform run in the memory. In view of this, the reliability of the memory needs to be ensured during the running of the system platform.

For example, in order to ensure that the memory can be used normally on a computer (a type of system platform), the memory needs to be tested in advance.

SUMMARY

The following is a summary of subject matters described in detail herein. This summary is not intended to limit the scope of protection of the claims.

The present disclosure provides a memory test method, a memory test device, and a storage medium.

According to a first aspect of the embodiments of the present disclosure, a memory test method is provided, wherein the memory test method includes:
  obtaining a preset memory and a memory to be tested;
  setting the memory to be tested as a reserved memory;
  starting an operating system, wherein the operating system runs in the preset memory; and
  executing a memory test program to test the memory to be tested, wherein the memory test program runs in the preset memory.

In some embodiments, the setting the memory to be tested as a reserved memory includes:
  mapping the preset memory to a first part of a system address space, and mapping the memory to be tested to a second part of the system address space, wherein the system address space is an address space of a kernel layer; and
  marking the second part as a reserved attribute.

In some embodiments, the first part and the second part are arranged in sequence.

In some embodiments, the first part and the second part are arranged adjacently or at intervals.

In some embodiments, the executing a memory test program to test the memory to be tested includes:
  obtaining a virtual address and length of the second part mapped to a virtual address space, wherein the virtual address space is an address space of an application layer; and
  test, according to the obtained virtual address and length, the memory to be tested.

In some embodiments, the obtaining a virtual address and length of the second part mapped to a virtual address space includes:
  loading a reserved memory driving module, wherein the reserved memory driving module is configured to obtain a physical address and length of a reserved part of the system address space, and map the obtained physical address and length to the virtual address space, wherein the reserved part is the part marked as the reserved attribute in the system address space; and
  invoking an interface of the reserved memory driving module to obtain the virtual address and first length of the memory to be tested.

In some embodiments, before the starting an operating system, the memory test method further includes:
  transferring an image file of the operating system to the preset memory.

In some embodiments, the preset memory is a known good memory.

In some embodiments, the memory to be tested includes a double data rate synchronous dynamic random-access memory and/or a synchronous dynamic random-access memory.

According to a second aspect of the embodiments of the present disclosure, a memory test apparatus is provided, wherein the memory test apparatus includes:
  an obtaining module configured to obtain a preset memory and a memory to be tested;
  a setting module configured to set the memory to be tested as a reserved memory; and
  an execution module configured to start an operating system, wherein the operating system runs in the preset memory; and the execution module Is further configured to execute a memory test program to test the memory to be tested, wherein the memory test program runs in the preset memory.

In some embodiments, the setting module is further configured to:
  map the preset memory to a first part of a system address space, and map the memory to be tested to a second part of the system address space, wherein the system address space is an address space of a kernel layer; and
  mark the second part as a reserved attribute.

In some embodiments, the first part and the second part are arranged in sequence.

In some embodiments, the first part and the second part are arranged adjacently or at intervals.

In some embodiments, the execution module is further configured to:
  obtain a virtual address and length of the second part mapped to a virtual address space, wherein the virtual address space is an address space of an application layer; and
  test, according to the obtained virtual address and length, the memory to be tested.

In some embodiments, the execution module is further configured to:
  load a reserved memory driving module, wherein the reserved memory driving module is configured to obtain a physical address and length of a reserved part of the system address space, and map the obtained physical address and length to the virtual address space, wherein the reserved part is the part marked as the reserved attribute in the system address space; and invoke an interface of the reserved memory driving module to obtain the virtual address and length of the memory to be tested.

In some embodiments, the memory test apparatus further includes:

a transfer module configured to transfer an image file of the operating system to the preset memory.

In some embodiments, the preset memory is a known good memory.

In some embodiments, the memory to be tested includes a double data rate synchronous dynamic random-access memory and/or a synchronous dynamic random-access memory.

According to a third aspect of the embodiments of the present disclosure, a memory test device is provided, wherein the memory test device includes:

a processor; and
a storage for storing an instruction executable by the processor,
wherein the processor is configured to perform the memory test method as described in the first aspect.

According to a fourth aspect of the embodiments of the present disclosure, a non-temporary computer-readable storage medium is provided, wherein when an instruction in the storage medium is executed by a processor of a memory test device, the memory test device is enabled to perform the memory test method as described in the first aspect.

The foregoing technical solutions used in the embodiments of the present disclosure have the following advantages: In the memory test method, a preset memory is prepared in advance, and an operating system and a memory test program are both run in the preset memory to test all memory units of a memory to be tested. According to the memory test method, the memory to be tested is placed in an operating environment of the operating system for testing, and a test result is more reliable. Moreover, the memory to be tested does not run the operating system and the memory test program. Therefore, when the memory to be tested is tested, a coupling effect between the memory units in the memory to be tested can be eliminated to better ensure the reliability of the test.

It should be understood that the above general description and the following detailed description are only exemplary and explanatory, and should not be construed as a limitation to the present disclosure.

BRIEF DESCRIPTION OF THE DRAWINGS

The drawings incorporated into the specification and constituting a part of the specification illustrate the embodiments of the present disclosure, and are used together with the description to explain the principles of the embodiments of the present disclosure. In these drawings, similar reference signs are used to represent similar elements. The drawings in the following description are some rather than all of the embodiments of the present disclosure. Persons of ordinary skill in the art can obtain other drawings based on these drawings without creative efforts.

DETAILED DESCRIPTION

In order to make the objectives, technical solutions, and advantages of the embodiments of the present disclosure clearer, the technical solutions in the embodiments of the present disclosure will be clearly and completely described below in conjunction with the accompanying drawings in the embodiments of the present disclosure. Apparently, the described embodiments are some rather than all of the embodiments of the present disclosure. All other embodiments derived by persons of ordinary skill in the art on the basis of the embodiments in the present disclosure without creative efforts shall fall within the scope of protection of the present disclosure. It should be noted that the embodiments and the features there of in the present disclosure may be combined with each other in a non-conflicting situation.

The present disclosure provides a memory test method. In the memory test method, a preset memory is prepared in advance, and an operating system and a memory test program are both run in the preset memory to test all memory units of a memory to be tested. According to the memory test method, the memory to be tested is placed in an operating environment of the operating system for testing, and a test result is more reliable. Moreover, the memory to be tested does not run the operating system and the memory test program. Therefore, when the memory to be tested is tested, a coupling effect between the memory units in the memory to be tested can be eliminated to better ensure the reliability of the test.

During a memory test, usually, a memory to be tested (such as double data rate synchronous dynamic random-access memory (DDR SDRAM) or other memory (DRAM), for example, synchronous dynamic random-access memory (SDRAM)) needs to be trained, to obtain the best operating parameters of the memory to be tested, so that the memory to be tested can run stably at a high speed, facilitating the test of the memory to be tested.

Generally, there are two memory test methods.

In a first method, a test is performed after a memory to be tested is trained and before an operating system is started.

In a second method, a test is performed after a memory to be tested is trained and an operating system is started.

In the first method, the memory to be tested is not placed in a real operating environment of the operating system, and a test result is less reliable.

In the second method, the memory to be tested needs to be divided into two parts, one of which is used to run the operating system, a memory test program, etc., to test the other part; and then the operating system is restarted, and the operating system and the memory test program are run in the other part, to test the part that has not been tested before. However, in this method, some memory units in the memory to be tested are always in use, and coupling easily occurs between the memory units in use and memory units not in use, which will also affect the reliability of a test result.

Figure 1:
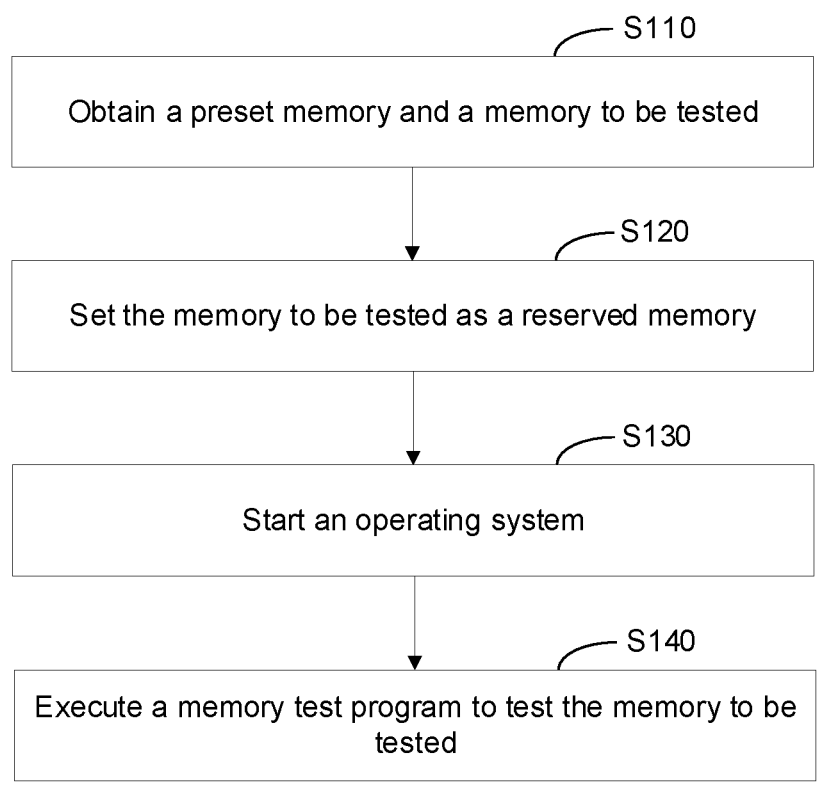
FIG. 1 is a flowchart showing a memory test method according to an embodiment of the present disclosure.

In some embodiments of the present disclosure, a memory test method is provided. The memory test method may be applied to a memory test device (also referred to as a memory test platform). As shown in FIG. 1, the memory test method may include:

S110: obtaining a preset memory and a memory to be tested;

S120: setting the memory to be tested as a reserved memory;

S130: starting an operating system; and

S140: executing a memory test program to test the memory to be tested.

In step S110, the preset memory and the memory to be tested are placed in the memory test device in advance. After the memory test device is powered on and started, a controller (also referred to as a central processing unit (CPU)) of the memory test device can monitor the preset memory and the memory to be tested, so that the controller obtains the preset memory and the memory to be tested.

In step S120, an address bus in the controller may be used to map the preset memory to a first part of a system address space, and map the memory to be tested to a second part of the system address space. Then a boot program (such as a BIOS (Basic Input Output System) program, a uboot (Universal Boot Loader), or lk (Little Kernel)) marks the second part as a reserved attribute.

After obtaining the preset memory and the memory to be tested, the controller may map the preset memory and the memory to be tested to the system address space, wherein the system address space is an address space of a kernel layer. After the preset memory and the memory to be tested are mapped to the system address space, the controller may perform unified management on the preset memory and the memory to be tested, set the memory to be tested as a reserved memory, and no longer use the memory to be tested.

Example 1

The controller maps the preset memory to the first part of the system address space, maps the memory to be tested to the second part of the system address space, and marks the second part as the reserved attribute. Then the controller no longer invokes a physical address of the second part, and no longer uses the memory to be tested, so as to set the memory to be tested as the reserved memory.

In step S130, the memory includes a plurality of memory units, and when the memory is not fully used, coupling may occur between used memory units and unused memory units. If the foregoing memory is tested in the above case, a test result will be unreliable. Therefore, in this step, the operating system runs in the preset memory.

The second part of the system address space is marked as the reserved attribute, that is, the memory to be tested is set as the reserved memory. Therefore, after the operating system is started, the operating system does not run in the memory to be tested, but runs in the preset memory, so as to ensure that the memory to be tested is not in use. In other words, after the operating system is started, any memory cell in the memory to be tested is not used. In this way, coupling between used memory units and unused memory units in the memory to be tested can be avoided, and therefore the test of the memory to be tested will not be affected.

It should be noted that the memory to be tested may be a memory applied to devices such as a notebook computer, a desktop computer, a tablet computer, and a mobile phone. When the memory to be tested is applied to different devices, different operating systems are used to test the memory to be tested. Certainly, when the memory to be tested is applied to different devices, different preset memory is used. Therefore, generally, a type of the preset memory is the same as a type of the memory to be tested.

Certainly, the type of the preset memory may also be different from the type of the memory to be tested. For example, if a Windows system needs to be run when the memory to be tested is in use, the preset memory only needs to be able to run the Windows system, and the type of the preset memory does not necessarily be the same as the type of memory to be tested.

Step S140 is similar to step S130, and in step S140, the memory test program runs in the preset memory.

Because the memory to be tested is set as the reserved memory, the memory test program also runs in the preset memory, thereby ensuring that the memory to be tested is not in use and ensuring the reliability of the test of the memory to be tested.

In the memory test method, the operating system and the memory test program are run in the preset memory, to test the memory to be tested, thereby testing all memory units in the memory to be tested in a real operating phase of the operating system, and the coupling between the memory units in the memory to be tested can be well avoided, thereby ensuring the reliability of the test result. In addition, there is no need to restart the operating system in the memory test method, which can further improve the efficiency of the test.

It should be noted that in this memory test method, the preset memory may be a known good memory, so as to ensure that the operating system and the memory test program can run well in the preset memory, and ensure the smooth progress of the entire test.

In addition, in the memory test method, the preset memory may be a set of memories (that is, at least two memories) or one memory. The memory to be tested may also be a set of memories (that is, at least two memories) or one memory. To be specific, in the memory test method, at least one memory to be tested may be tested by presetting at least one memory, so as to further extend the use range of the memory test method and also improve the test efficiency.

In some embodiments of the present disclosure, a memory test method is provided. In the memory test method, the first part and the second part may be arranged alternately.

Example 1

Figure 1A:
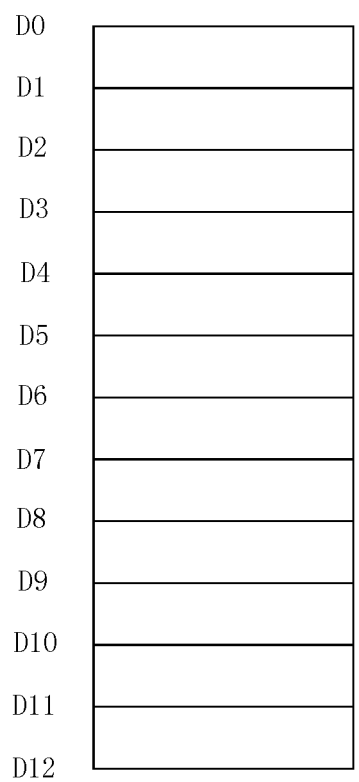
FIG. 1A is a schematic diagram showing a system address space according to an embodiment of the present disclosure.
Figure 1B:
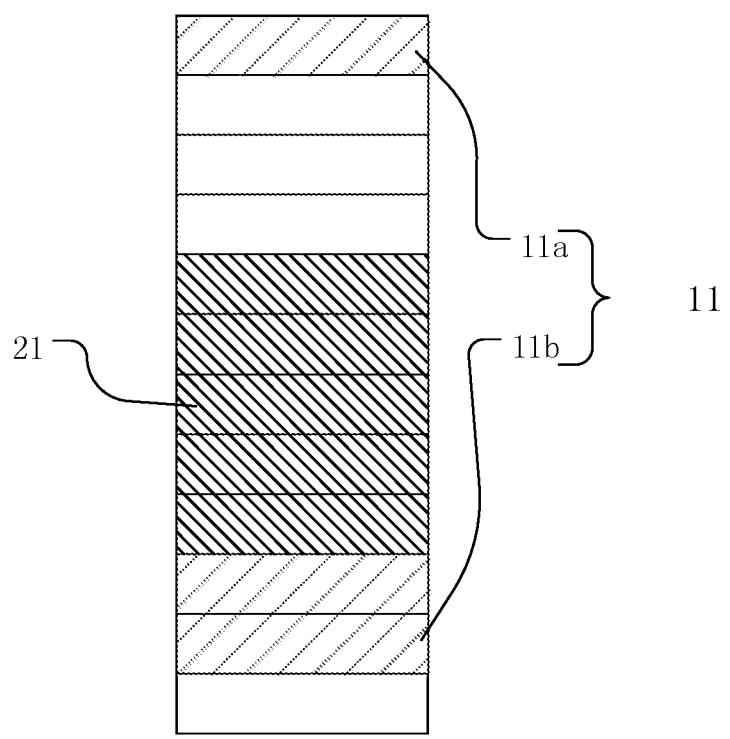
FIG. 1B is a schematic diagram showing an arrangement of a first part and a second part in a system address space according to an embodiment of the present disclosure.

As shown in FIGS. 1A and 1B, physical addresses D0 to D12 may be set in the system address space, wherein adjacent physical addresses may represent 1G memory. A size of the preset memory may be 3G, and a size of the memory to be tested may be 5G.

Physical addresses of a first part 11 in the system address space to which the preset memory is mapped may be D0 to D1 (denoted as 11a) and D9 to D11 (denoted as 11b). Physical addresses of a second part 21 in the system address space to which the memory to be tested is mapped may be D4 to D9.

In this example, the second part 21 is located between 11*a* and 11*b* of the first part. In other words, the first part 11 and the second part 21 are arranged alternately.

Example 2

Figure 1C:
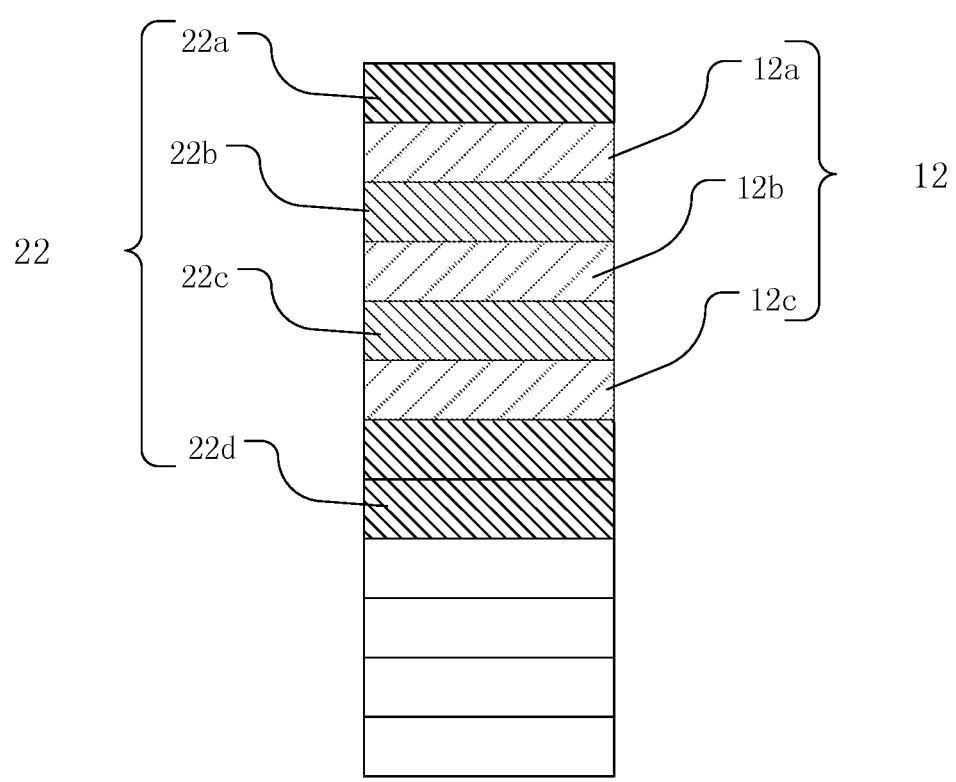
FIG. 1C is a schematic diagram showing an arrangement of a first part and a second part in a system address space according to an embodiment of the present disclosure.

As shown in FIGS. 1A and 1C, physical addresses D0 to D12 may be set in the system address space, wherein adjacent physical addresses may represent 1G memory. A size of the preset memory may be 3G, and a size of the memory to be tested may be 5G.

Physical addresses of a first part 12 in the system address space to which the preset memory is mapped may be D1 to D2 (denoted as 12*a*), D3 to D4 (denoted as 12*b*), and D5 to D6 (denoted as 12*c*). Physical addresses of a second part 22 in the system address space to which the memory to be tested is mapped may be D0 to D1 (denoted as 22*a*), D2 to D3 (denoted as 22*b*), D4 to D5 (denoted as 22*c*), and D6 to D8 (denoted as 22*d*).

In this example, in the system address space, 22*a* of the second part, 12*a* of the first part, 22*b* of the second part, 12*b* of the first part, 22*c* of the second part, 12*c* of the first part, and 22*d* of the second part are arranged in sequence. In other words, the first part 12 and the second part 22 are arranged alternately.

Certainly, in this memory test method, the first part and the second part may alternatively be arranged in sequence, so that the second part is quickly marked as a reserved attribute in the system address space.

The sequential arrangement means that the first part and the second part are not alternate in the system address space. The sequential arrangement includes an adjacent arrangement and a separated arrangement. To be specific, the first part and the second part may be arranged adjacently or at intervals.

Example 3

Figure 1D:
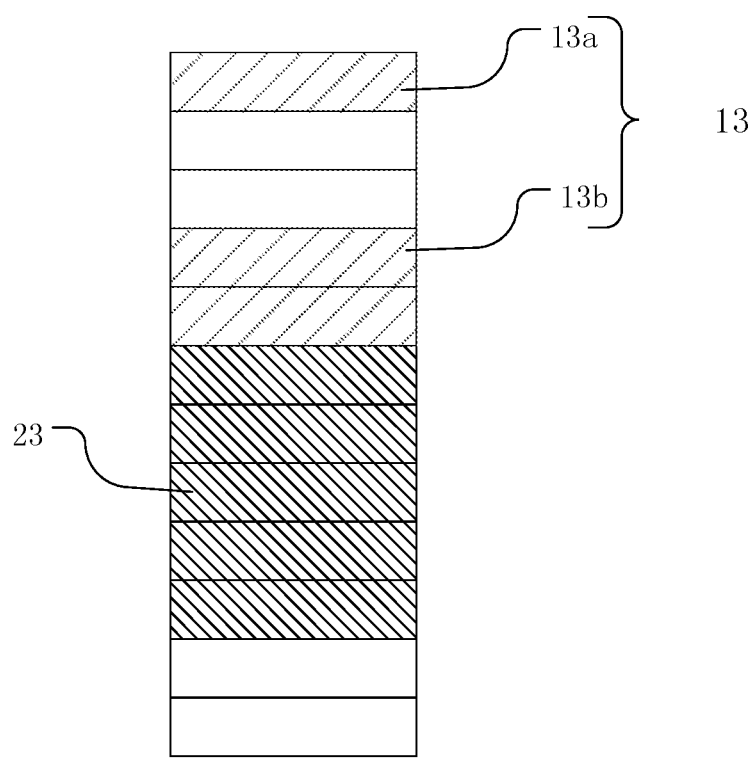
FIG. 1D is a schematic diagram showing an arrangement of a first part and a second part in a system address space according to an embodiment of the present disclosure.

As shown in FIGS. 1A and 1D, physical addresses D0 to D12 may be set in the system address space, wherein adjacent physical addresses may represent 1G memory. A size of the preset memory may be 3G, and a size of the memory to be tested may be 5G.

Physical addresses of a first part 13 in the system address space to which the preset memory is mapped may be D0 to D1 (denoted as 13*a*) and D3 to D5 (denoted as 13*b*). Physical addresses of a second part 23 in the system address space to which the memory to be tested is mapped may be D5 to D10.

In this example, although the first part is arranged apart (divided into 13*a* and 13*b*) and the second part is arranged together, 13*a* and 13*b* of the first part and the second part 23 are not alternate. In the system address space, the first part 13 and the second part 23 are still arranged in sequence.

Example 4

Figure 1E:
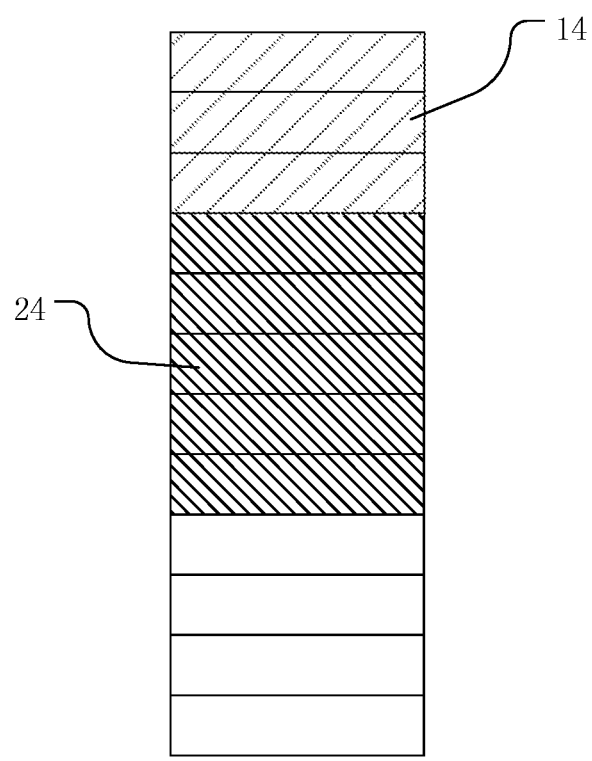
FIG. 1E is a schematic diagram showing an arrangement of a first part and a second part in a system address space according to an embodiment of the present disclosure.

As shown in FIGS. 1A and 1E, physical addresses D0 to D12 may be set in the system address space, wherein adjacent physical addresses may represent 1G memory. A size of the preset memory may be 3G, and a size of the memory to be tested may be 5G.

Physical addresses of a first part 14 in the system address space to which the preset memory is mapped may be D1 to D4. Physical addresses of a second part 24 in the system address space to which the memory to be tested is mapped may be D4 to D9.

In this example, the first part 14 is arranged together, the second part 24 is arranged together, and the first part 14 and the second part 24 are arranged adjacently and are not alternate. In the system address space, the first part 14 and the second part 24 are still arranged in sequence.

Example 5

Figure 1F:
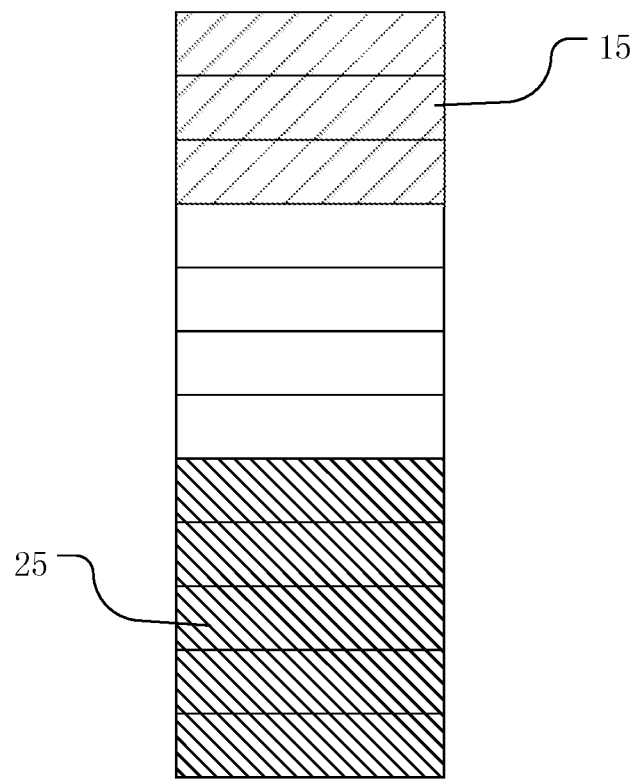
FIG. 1F is a schematic diagram showing an arrangement of a first part and a second part in a system address space according to an embodiment of the present disclosure.

As shown in FIGS. 1A and 1F, physical addresses D0 to D12 may be set in the system address space, wherein adjacent physical addresses may represent 1G memory. A size of the preset memory may be 3G, and a size of the memory to be tested may be 5G.

Physical addresses of a first part 15 in the system address space to which the preset memory is mapped may be D0 to D3. Physical addresses of a second part 25 in the system address space to which the memory to be tested is mapped may be D7 to D12.

In this example, the first part 15 is arranged together, the second part 25 is arranged together, and the first part 15 and the second part 25 are not alternate and are arranged spaced apart, which makes it easier to mark the second part 25 as a reserved attribute.

It should be noted that in the above three examples (Example 3 to Example 5), a part of the system address space other than the first part and the second part may be denoted as a third part. Physical addresses in the system address space to which other components in the memory test device are mapped may belong to the third part. For example, the other components may include a flash memory, a CPU, etc.

In the memory test method, when the preset memory is mapped to the first part of the system address space, and the memory to be tested is mapped to the second part of the system address space, the first part and the second part may be arranged in sequence, so that the part to which the memory to be tested is mapped is better distinguished in the system address space, and the second part to which the memory to be tested is mapped in the system address space is easily marked as a reserved attribute, which helps efficiently set the memory to be tested as a reserved memory, and improve the efficiency of the test of the memory to be tested.

In some embodiments of the present disclosure, a memory test method is provided. Before the starting an operating system, the memory test method further includes: transferring an image file of the operating system to the preset memory.

The image file of the operating system may be obtained from the cloud, or may be obtained from another component in the memory test device, for example, from a flash memory in the memory test device.

Example 1

The memory to be tested is applied to a notebook computer. A flash memory of the memory test device stores, in advance, an image file of an operating system (such as a unity operating system (UOS) or a Windows system) applied to the notebook computer. After the memory test device is powered on, a boot program on the memory test device is started. On the basis of the boot program, the foregoing image file in the flash memory is transferred to the preset memory.

Example 2

The memory to be tested is applied to a mobile phone. A flash memory of the memory test device stores, in advance, an image file of an operating system (such as a Harmony operating system (Harmony OS) or an Android system) applied to the mobile phone. After the memory test device is powered on, a boot program on the memory test device is started. On the basis of the boot program, the foregoing image file in the flash memory is transferred to the preset memory.

In addition, when the image file of the operating system is obtained from the cloud, a corresponding operating system may be downloaded from the cloud depending on a type of a device to which the memory to be tested is applied.

Example 3

The memory to be tested is applied to a notebook computer. After the memory test device is powered on, a user may download, from the cloud, an image file of an operating system (such as a unity operating system (UOS) or a Windows system) applied to the notebook computer, and directly download the image file of the operating system to the preset memory.

Example 4

The memory to be tested is applied to a mobile phone. After the memory test device is powered on, a user may download, from the cloud, an image file of an operating system (such as a Harmony operating system (Harmony OS) or an Android system) applied to the mobile phone, and directly download the image file of the operating system to the preset memory.

In the memory test method, the image file of the operating system is not preset in the preset memory, but the image file of the operating system in another location (such as the cloud) may be transferred to the preset memory, so that depending on a type of a device to which the memory to be tested is applied, an image file of an operating system corresponding to the type is transferred to the preset memory, which extends the scope of application of the memory test method.

Certainly, it should be noted that in the memory test method, a plurality of preset memories may alternatively be set in advance, and each preset memory pre-stores an image file of one operating system, so that an appropriate preset memory is selected according to a type of a device to which the memory to be tested is applied, to test the memory to be tested.

In some embodiments of the present disclosure, a memory test method is provided. In the memory test method, the executing a memory test program to test the memory to be tested includes:

S210: obtaining a virtual address and length of the second part mapped to a virtual address space; and S220: testing, according to the obtained virtual address and length, the memory to be tested.

In step S210, the virtual address space is an address space of an application layer.

When an application runs, the virtual address and length of the virtual address space are usually required to invoke a physical address and length of a real memory in the system address space, and then invoke the real memory. In this way, the application runs in the real memory.

In this step, after the memory test program runs, the controller of the memory test device obtains, on the basis of the memory test program, the virtual address and length of the reserved part mapped to the virtual address space, wherein the reserved part is the second part formed by the physical address and length of the memory to be tested that is mapped to the system address space.

After obtaining the virtual address and length of the second part mapped to the virtual address space, the controller may invoke, on the basis of based on the obtained virtual address and length, the real memory (namely, the memory to be tested) corresponding to the second part, to test the memory to be tested.

The obtaining a virtual address and length of the second part mapped to a virtual address space may include:

S211: loading a reserved memory driving module; and

S212: invoking an interface of the reserved memory driving module to obtain the virtual address and length of the memory to be tested.

In step S211, the reserved memory driving module (an application program) is configured to: obtain a physical address and length of a reserved part of the system address space, and map the obtained physical address and length to the virtual address space. The reserved part is the part marked as the reserved attribute in the system address space.

To be specific, after the reserved memory driving module is loaded, the controller obtains, on the basis of the reserved memory driving module, the physical address and length of the reserved part in the system address space, and maps the obtained physical address and length to the virtual address space. In this way, a mapping relationship between the memory to be tested, the physical address and length, and the virtual address and length is established.

In step S212, the reserved memory driving module may be provided with an interface, wherein the interface is configured to obtain the virtual address and length of the reserved part mapped to the virtual address space.

In this step, the controller may invoke, on the basis of the memory test program, the interface of the reserved memory driving module, to obtain the virtual address and length of the reserved part mapped to the virtual address space. To be specific, the controller may invoke, on the basis of the memory test program, the interface of the reserved memory driving module, to obtain the virtual address and length of the memory to be tested that is mapped to the virtual address space, and then obtain the physical address and length of the memory to be tested that is mapped to the system address space, to test the memory to be tested.

In this method, the reserved memory driving module is run in the preset memory, and the physical address and length of the memory to be tested that is mapped to the system address space is mapped to the virtual address and length mapped to the virtual address space. In addition, the memory test program is run in the preset memory, to invoke the interface of the reserved memory driving module, to obtain the virtual address and length of the memory to be tested, and then test the memory to be tested, which implements a comprehensive test of the memory to be tested in the operating environment of the operating system, and can ensure the reliability of a test result.

The present disclosure further provides a memory test apparatus. The memory test apparatus is used to implement the memory test method described above. When the memory test apparatus is used to test the memory to be tested, the operating system and the memory test program are run in the preset memory, to test the memory to be tested, thereby testing all memory units in the memory to be tested in a real operating phase of the operating system, and the coupling between the memory units in the memory to be tested can be well avoided, thereby ensuring the reliability of the test result. In addition, when the memory test apparatus is used to test the memory to be tested, there is no need to restart the operating system in the memory test method, which can further improve the efficiency of the test.

Figure 2:
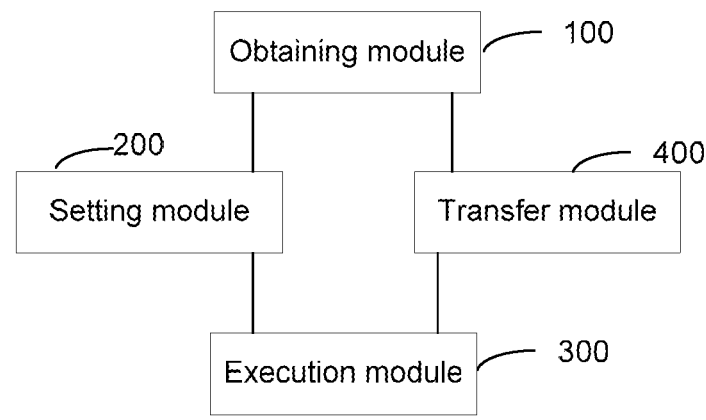
FIG. 2 is a block diagram showing a memory test apparatus according to an exemplary embodiment.

In an exemplary embodiment, a memory test apparatus is provided. As shown in FIG. 2, the memory test apparatus may include an obtaining module 100, a setting module 200, and an execution module 300. In the process of the memory test apparatus implementing the foregoing memory test method, the obtaining module 100 is configured to obtain a preset memory and a memory to be tested;

the setting module 200 is configured to set the memory to be tested as a reserved memory;

the execution module 300 is configured to start an operating system, wherein the operating system runs in the preset memory; and the execution module 300 is further configured to execute a memory test program to test the memory to be tested, wherein the memory test program runs in the preset memory.

In an exemplary embodiment, a memory test apparatus is provided. As shown in FIG. 2, in the memory test apparatus, the setting module 200 is further configured to:

map the preset memory to a first part of a system address space, and map the memory to be tested to a second part of the system address space, wherein the system address space is an address space of a kernel layer; and mark the second part as a reserved attribute.

In an exemplary embodiment, a memory test apparatus is provided. In the memory test apparatus, the first part and the second part are arranged in sequence.

In an exemplary embodiment, a memory test apparatus is provided. In the memory test apparatus, the first part and the second part are arranged adjacently or at intervals.

In an exemplary embodiment, a memory test apparatus is provided. As shown in FIG. 2, in the memory test apparatus, the execution module 300 is further configured to:

obtain a virtual address and length of the second part mapped to a virtual address space, wherein the virtual address space is an address space of an application layer; and test, according to the obtained virtual address and length, the memory to be tested.

In an exemplary embodiment, a memory test apparatus is provided. As shown in FIG. 2, in the memory test apparatus, the execution module 300 is further configured to:

load a reserved memory driving module, wherein the reserved memory driving module is configured to obtain a physical address and length of a reserved part of the system address space, and map the obtained physical address and length to the virtual address space, wherein the reserved part is the part marked as the reserved attribute in the system address space; and invoke an interface of the reserved memory driving module to obtain the virtual address and length of the memory to be tested.

In an exemplary embodiment, a memory test apparatus is provided. As shown in FIG. 2, in the memory test apparatus, the memory test apparatus further includes:

a transfer module 400 configured to transfer an image file of the operating system to the preset memory.

In an exemplary embodiment, a memory test apparatus is provided. In the memory test apparatus, the preset memory is a known good memory.

In an exemplary embodiment, a memory test apparatus is provided. In the memory test apparatus, the memory to be tested includes a double data rate synchronous dynamic random-access memory and/or a synchronous dynamic random-access memory.

In an exemplary embodiment, a memory test device is provided.

Figure 3:
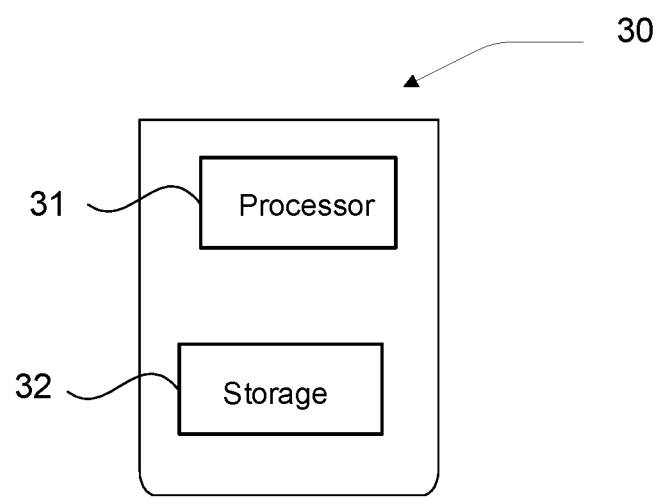
FIG. 3 is a block diagram showing a memory test device according to an exemplary embodiment.

As shown in FIG. 3, the memory test device 30 is used to implement the memory test method described above. The memory test device 30 may be provided as a server. The memory test device 30 may include a processor 31, and one or more processors may be set as required. The memory test device 30 may further include a storage 32 configured to store an instruction, such as an application program, executable by the processor 31. One or more storage may be set as required. The storage may store one or more application programs. The processor 31 is configured to execute the instruction to perform the foregoing memory test method.

For example, the processor 31 is configured to:

obtain a preset memory and a memory to be tested;

set the memory to be tested as a reserved memory;

start an operating system, wherein the operating system runs in the preset memory; and execute a memory test program to test the memory to be tested, wherein the memory test program runs in the preset memory.

In an exemplary embodiment, a non-temporary computer-readable storage medium (not shown in the figure) is provided. When an instruction in the storage medium is executed by a processor of the foregoing memory test device, the memory test device is enabled to perform the foregoing memory test method.

For example, when executed by the processor of the foregoing memory test device, the instruction in the storage medium enables the memory test device to:

obtain a preset memory and a memory to be tested;

set the memory to be tested as a reserved memory;

start an operating system, wherein the operating system runs in the preset memory; and execute a memory test program to test the memory to be tested, wherein the memory test program runs in the preset memory.

Persons skilled in the art should understand that the embodiments of the present disclosure may be provided as a method, an apparatus (device), or a computer program product. Therefore, the present disclosure may use a form of hardware only embodiments, software only embodiments, or embodiments with a combination of software and hardware. Moreover, the present invention may be in a form of a computer program product that is implemented on one or more computer-usable storage media that include computer-usable program code. The computer storage media include volatile and non-volatile, removable and non-removable media implemented in any method or technology for storing information (such as computer-readable instructions, data structures, program modules, or other data), including but not limited to, a RAM, a ROM, an EEPROM, a flash memory or other storage technologies, a CD-ROM, a digital versatile disk (DVD) or other optical disc storage, a magnetic cassette, a magnetic tape, magnetic disk storage or other magnetic storage apparatuses, or any other medium that can be used to store desired information and can be accessed by a computer. In addition, as is well known to persons of ordinary skill in the art, the communication media usually contain computer-readable instructions, data structures, program modules, or other data in modulated data signals such as carrier waves or other transmission mechanisms, and may include any information transfer medium.

The present disclosure is described with reference to the flowcharts and/or block diagrams of the method, the apparatus (device), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable storage that can instruct the computer or any other programmable data processing device to work in a specific manner, so that the instructions stored in the computer readable storage generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or another programmable device, thereby generating computer-implemented processing. Therefore, the instructions executed on the computer or another programmable device provide steps for implementing a function specified in one or more processes in the flowcharts and/or in one or more blocks in the block diagrams.

In the specification, the terms "include", "comprise", or any other variations thereof are intended to cover a non-exclusive inclusion, so that an article or a device including a series of elements not only includes those elements, but also includes other elements that are not explicitly listed, or also includes inherent elements of the article or the device. Without more restrictions, the elements defined by the statement "including a . . . " do not exclude the existence of other identical elements in the article or device including the elements.

Although some preferred embodiments of the present disclosure have been described, persons skilled in the art can make changes and modifications to these embodiments once they learn the basic inventive concept. Therefore, the appended claims are intended to be interpreted as including the preferred embodiments and all changes and modifications falling within the scope of the present disclosure.

Apparently, persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications.

INDUSTRIAL APPLICABILITY

In the memory test method and device, and the storage medium provided in the present disclosure, a preset memory is prepared in advance, and an operating system and a memory test program are both run in the preset memory to test all memory units of a memory to be tested. According to the memory test method, the memory to be tested is placed in an operating environment of the operating system for testing, and a test result is more reliable. Moreover, the memory to be tested does not run the operating system and the memory test program. Therefore, when the memory to be tested is tested, a coupling effect between the memory units in the memory to be tested can be eliminated to better ensure the reliability of the test.

What is claimed is:

1. A memory test method, comprising:
    obtaining a preset memory and a memory to be tested;
    setting the memory to be tested as a reserved memory;
    starting an operating system, the operating system running in the preset memory; and
    executing a memory test program to test the memory to be tested, the memory test program running in the preset memory.

2. The memory test method according to claim 1, wherein the setting the memory to be tested as a reserved memory comprises:
    mapping the preset memory to a first part of a system address space, and mapping the memory to be tested to a second part of the system address space, wherein the system address space is an address space of a kernel layer; and
    marking the second part as a reserved attribute.

3. The memory test method according to claim 2, wherein the first part and the second part are arranged in sequence.

4. The memory test method according to claim 3, wherein the first part and the second part are arranged adjacently or at intervals.

5. The memory test method according to claim 2, wherein the executing a memory test program to test the memory to be tested comprises:
    obtaining a virtual address and length of the second part mapped to a virtual address space, wherein the virtual address space is an address space of an application layer; and
    testing, according to the obtained virtual address and length, the memory to be tested.

6. The memory test method according to claim 5, wherein the obtaining a virtual address and length of the second part mapped to a virtual address space comprises:
    loading a reserved memory driving module, wherein the reserved memory driving module is configured to obtain a physical address and length of a reserved part of the system address space, and map the obtained physical address and length to the virtual address space, wherein the reserved part is the part marked as the reserved attribute in the system address space; and
    invoking an interface of the reserved memory driving module to obtain the virtual address and length of the memory to be tested.

7. The memory test method according to claim 1, wherein before the starting an operating system, the memory test method further comprises:
    transferring an image file of the operating system to the preset memory.

8. The memory test method according to claim 1, wherein the preset memory is a known good memory.

9. The memory test method according to claim 1, wherein the memory to be tested comprises a double data rate synchronous dynamic random-access memory and/or a synchronous dynamic random-access memory.

10. A memory test apparatus comprising:
- an obtaining module, configured to obtain a preset memory and a memory to be tested;
- a setting module, configured to set the memory to be tested as a reserved memory; and
- an execution module, configured to start an operating system, the operating system running in the preset memory;
- and further configured to execute a memory test program to test the memory to be tested, the memory test program running in the preset memory.

11. The memory test apparatus according to claim 10, wherein the setting module is further configured to:
- map the preset memory to a first part of a system address space, and map the memory to be tested to a second part of the system address space, wherein the system address space is an address space of a kernel layer; and
- mark the second part as a reserved attribute.

12. The memory test apparatus according to claim 11, wherein the first part and the second part are arranged in sequence.

13. The memory test apparatus according to claim 12, wherein the first part and the second part are arranged adjacently or at intervals.

14. The memory test apparatus according to claim 11, wherein the execution module is further configured to:
- obtain a virtual address and length of the second part mapped to a virtual address space, wherein the virtual address space is an address space of an application layer; and
- test, according to the obtained virtual address and length, the memory to be tested.

15. The memory test apparatus according to claim 14, wherein the execution module is further configured to:
- load a reserved memory driving module, wherein the reserved memory driving module is configured to obtain a physical address and length of a reserved part of the system address space, and map the obtained physical address and length to the virtual address space, wherein the reserved part is the part marked as the reserved attribute in the system address space; and
- invoke an interface of the reserved memory driving module to obtain the virtual address and length of the memory to be tested.

16. The memory test apparatus according to claim 10, wherein the memory test apparatus further comprises:
- a transfer module, configured to transfer an image file of the operating system to the preset memory.

17. The memory test apparatus according to claim 10, wherein the preset memory is a known good memory.

18. The memory test apparatus according to claim 10, wherein the memory to be tested comprises a double data rate synchronous dynamic random-access memory and/or a synchronous dynamic random-access memory.

19. A memory test device comprising:
- a processor, configured to perform a memory test method, wherein the memory test method comprises:
- obtaining a preset memory and a memory to be tested;
- setting the memory to be tested as a reserved memory;
- starting an operating system, the operating system running in the preset memory; and
- executing a memory test program to test the memory to be tested, the memory test program running in the preset memory; and
- a storage for storing an instruction, executable by the processor.

* * * * *